(12) United States Patent
Yim et al.

(10) Patent No.: US 8,216,861 B1
(45) Date of Patent: Jul. 10, 2012

(54) DIELECTRIC RECOVERY OF PLASMA DAMAGED LOW-K FILMS BY UV-ASSISTED PHOTOCHEMICAL DEPOSITION

(75) Inventors: Kang Sub Yim, Palo Alto, CA (US); Thomas Nowak, Cupertino, CA (US); Bo Xie, Santa Clara, CA (US); Alexandros T. Demos, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/171,132

(22) Filed: Jun. 28, 2011

(51) Int. Cl.
*H01L 21/00* (2006.01)

(52) U.S. Cl. .................. 438/4; 438/778; 257/E21.471

(58) Field of Classification Search ............... 438/403, 438/409; 257/E21.191, E21.317, E21.471, 257/E21.483, E21.497, E21.536
See application file for complete search history.

(56) References Cited

U.S. PATENT DOCUMENTS 7,470,454 B2 * 12/2008 Lukas et al. ................ 427/509
* cited by examiner

*Primary Examiner* — Cheung Lee
(74) *Attorney, Agent, or Firm* — Patterson & Sheridan, LLP

(57) ABSTRACT

Methods for the repair of damaged low k films are provided. Damage to the low k films occurs during processing of the film such as during etching, ashing, and planarization. The processing of the low k film causes water to store in the pores of the film and further causes hydrophilic compounds to form in the low k film structure. Repair processes incorporating ultraviolet (UV) radiation and carbon-containing compounds remove the water from the pores and further remove the hydrophilic compounds from the low k film structure.

10 Claims, 3 Drawing Sheets

DIELECTRIC RECOVERY OF PLASMA DAMAGED LOW-K FILMS BY UV-ASSISTED PHOTOCHEMICAL DEPOSITION

BACKGROUND OF THE INVENTION

1. Field of the Invention

Embodiments of the present invention generally relate to methods for repairing and lowering the dielectric constant of low k films for semiconductor fabrication.

2. Description of the Related Art

The dielectric constant (k) of dielectric films in semiconductor fabrication is continually decreasing as device scaling continues. Minimizing integration damage on low dielectric constant (low k) films is important to be able to continue decreasing feature sizes. However, as feature sizes shrink, improvement in the resistive capacitance and reliability of dielectric films becomes a serious challenge.

Current techniques for the etching or ashing of dielectric films involve process chemistries which create water ($H_2O$) as a byproduct. The water byproduct can be introduced into the deposited dielectric films, thereby increasing the k value of the dielectric film. Also, current techniques for the removal of copper oxides (CuO) and chemical mechanical planarization (CMP) residues involve the use of ammonia ($NH_3$) or hydrogen ($H_2$) plasmas. Removal of the copper oxides and CMP residues are necessary to improve the electromigration (EM) of the metallization structures and the time dependent dielectric breakdown (TDDB) of the ILD films. However, exposing low k films to $NH_3$ and $H_2$ plasmas modifies the film structure and increases the k value. Present repair techniques involve liquid phase silylation or use of supercritical $CO_2$. However, such techniques have not proven effective for repairing sidewall damage of recessed features in the films.

Thus, a method for repairing the dielectric films to lower the k value is necessary to improve efficiency and allow for smaller device sizes.

SUMMARY OF THE INVENTION

Embodiments of the present invention generally relate to methods for repairing and lowering the dielectric constant of low k films for semiconductor fabrication.

In one embodiment, a method of repairing a damaged low k dielectric film is provided. The method generally comprises positioning a dielectric film in a processing chamber, heating the processing chamber, flowing a carbon-containing precursor into the processing chamber, exposing the carbon-containing precursor and the dielectric film to ultra violet (UV) radiation, decomposing the carbon-containing precursor, and depositing carbon-containing compounds into pores of the dielectric film.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments of the present invention generally relate to methods for repairing and lowering the dielectric constant (k-value) of low k films for semiconductor fabrication.

Figure 1A:
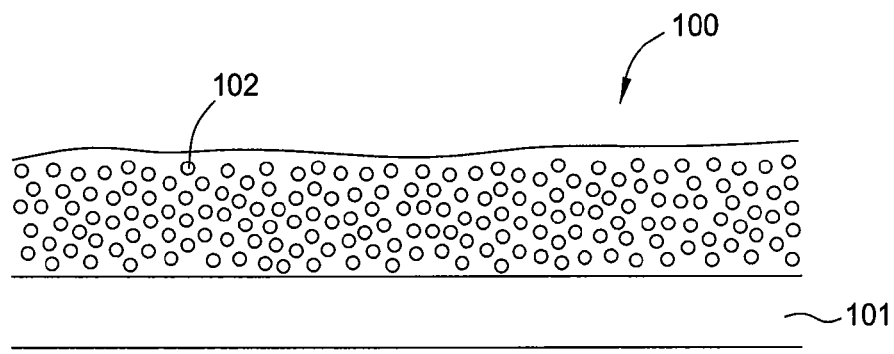
FIGS. 1A-1F illustrate a dielectric layer during various stages of processing.

FIG. 1A illustrates a dielectric film 100 deposited onto a structure 101. The structure 101 may be a substrate, such as, for example, a silicon wafer, or a previously formed layer, such as, for example, a metallization or interconnect layer. The dielectric film 100 may be a porous silicon containing low k film, such as, for example, $SiO_2$, Si+O+C, Si+O+N, Si+C+O+H, Si+O+C+N, or other related films. The dielectric film 100 may have pores 102 formed therein.

Figure 1B:
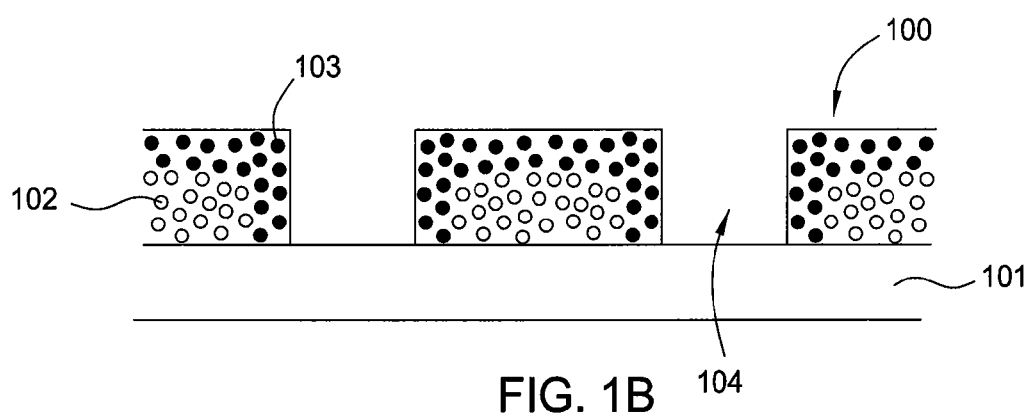

FIG. 1B illustrates the dielectric film 100 after being planarized and etched to form features 104 into the dielectric film 100. The dielectric film 100 may be planarized by a chemical mechanical planarization (CMP) process, for example. The dielectric film 100 may be etched by masking a portion of the dielectric film 100, contacting the unmasked portion of the dielectric film 100 with a plasma formed from hydrofluoric acid (HF) vapor, and ashing away the mask using a plasma formed from oxygen ($O_2$) gas or $CO_2$ gas, for example.

The planarization, ashing, and etching of the dielectric film 100 introduce hydrogen and/or water into the dielectric film 100 causing Si—OH groups to form, for example, which make the dielectric film 100 hydrophilic. The hydrophilic property of the dielectric film 100 causes the pores 102 to fill with water creating damaged pores 103. Both the Si—OH groups and damaged pores 103 increase the k-value of the dielectric film 100. The damage from the planarization and etching are usually localized to an upper portion of the dielectric film 100 and to the sidewalls of the features 104, as shown in FIG. 1B.

Figure 1C:
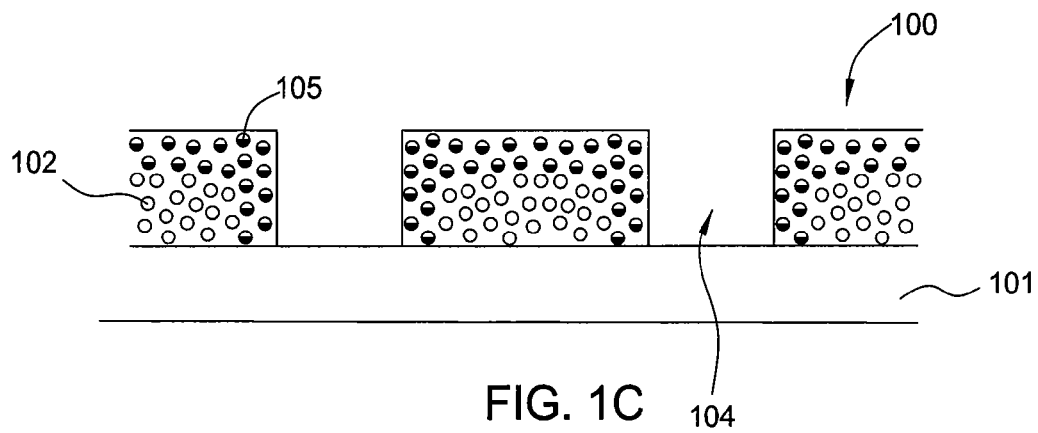

FIG. 1C illustrates the dielectric film 100 after being repaired by the repair processes described below. The repair processes decrease the k-value of the dielectric film 100 by removing the water from the damaged pores 103, thereby creating repaired pores 105, and by converting the Si—OH groups in the dielectric film 100 into hydrophobic Si—O—Si($CH_3$)$_3$ groups, for example. The hydrophobic Si—O—Si($CH_3$)$_3$ groups assist in driving water out of the damaged pores 103 of the dielectric film 100.

In one embodiment, the dielectric film 100 may be repaired by an ultraviolet (UV) assisted chemical vapor deposition (CVD) process. The UV-CVD process comprises contacting the dielectric film 100 with a carbon-containing compound in the presence of UV radiation to create the Si—O—Si($CH_3$)$_3$ groups in the dielectric film 100 described above.

Figure 2A:
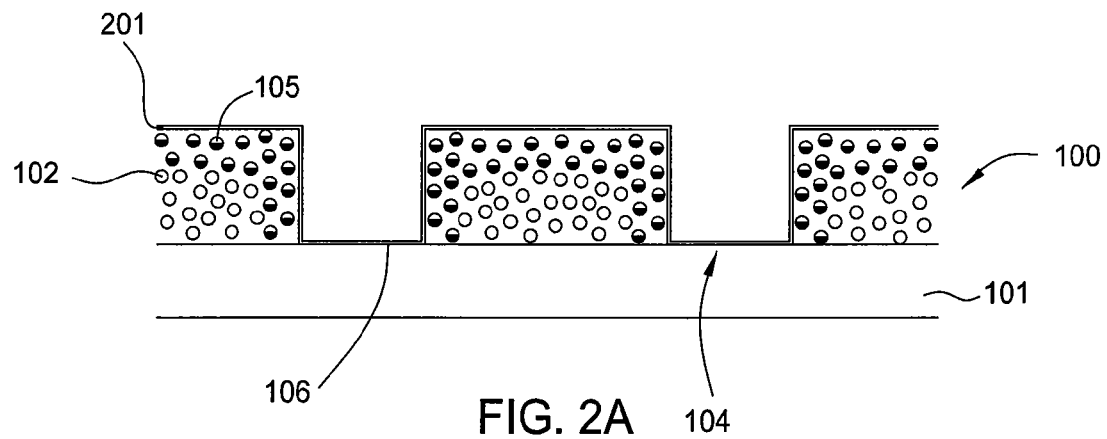
FIGS. 2A-2B illustrate a dielectric layer having a thin carbon film during various stages of processing.

For example, the UV-CVD process may be conducted by placing the dielectric film 100 into a processing chamber, heating the processing chamber, flowing a gas phase carbon-containing precursor into the processing chamber, engaging a source of UV radiation to contact the carbon-containing precursor and the dielectric film 100 with UV radiation, decomposing the carbon-containing precursor with the UV radiation, and depositing carbon-containing compounds into the damaged pores 103 of the dielectric film 100. In one embodiment, the UV radiation and the carbon-containing precursor are supplied simultaneously. A thin carbon-containing film 201 may be deposited onto the repaired dielectric film 100 during the repair process, as seen in FIG. 2A. The thin carbon-containing film 201 may be up to 10 Å thick. The thin carbon-containing film 201 may be optionally removed, as shown in FIG. 1C, by sublimation or by diffusion into the dielectric film 100.

Suitable carbon-containing precursors include, but are not limited to, ethylene, acetylene, 1,3-butadiene, and isoprene. Other suitable carbon-containing precursors include compounds containing double carbon-carbon bonds (C═C) and/or triple carbon-carbon bonds (C≡C). The UV radiation may be adjusted to contain specific wavelengths which are absorbent by the particular carbon-containing precursor being used for efficiency in decomposing the carbon-containing precursor during the repair process. For example, 1,3-butadiene is highly absorbent to UV radiation having wavelengths between 200 nm and 220 nm, while acetylene is highly absorbent to UV radiation having wavelengths between 120 nm and 180 nm. The UV radiation may have wavelengths between 10 nm and 400 nm, for example between 20 nm and 230 nm. The processing chamber may also be heated to a temperature beneficial to the decomposition of the carbon-containing precursor.

One advantage of using gas phase precursors is that the molecules can penetrate deeper into the film than liquid phase precursors. Also, the use of UV radiation is advantageous as the UV radiation assists in converting the Si—OH groups in the dielectric film 100 into hydrophobic Si—O—Si(CH$_3$)$_3$ groups.

The UV-CVD process may be conducted at a processing chamber pressure between 1 Torr and 100 Torr, such as 10 Torr, a dielectric film temperature between 0° C. and 400° C., such as 200° C., a carbon-containing precursor flow rate between 10 sccm and 5000 sccm, such as 500 sccm, and a processing time between 5 sec and 300 sec, such as 30 sec.

Figure 1D:
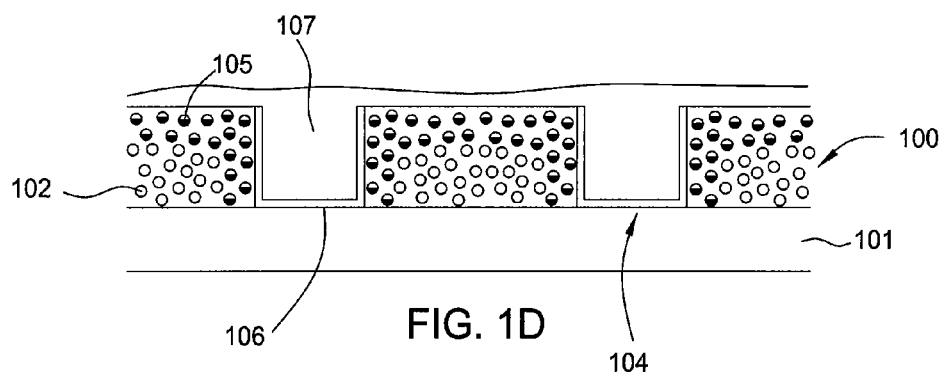
Figure 1E:
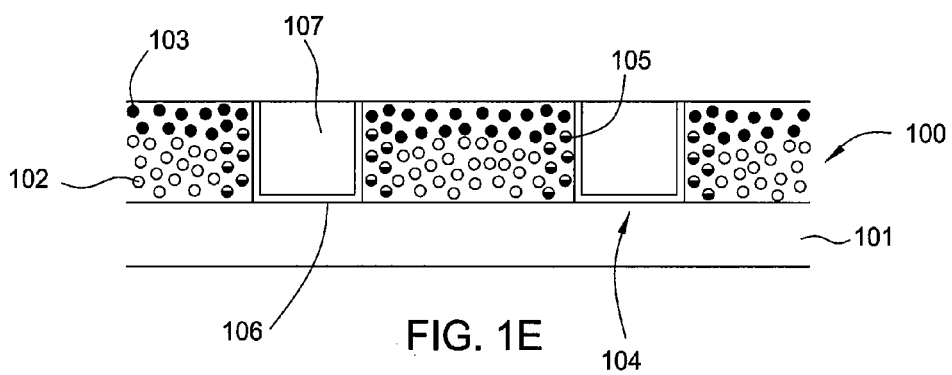
Figure 1F:
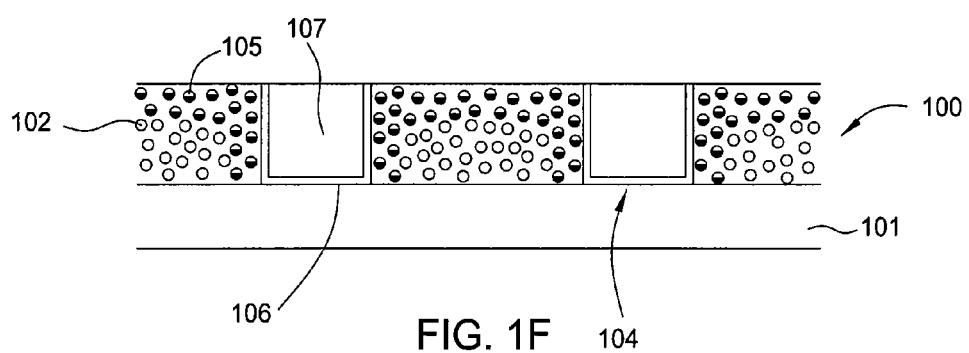
Figure 2B:
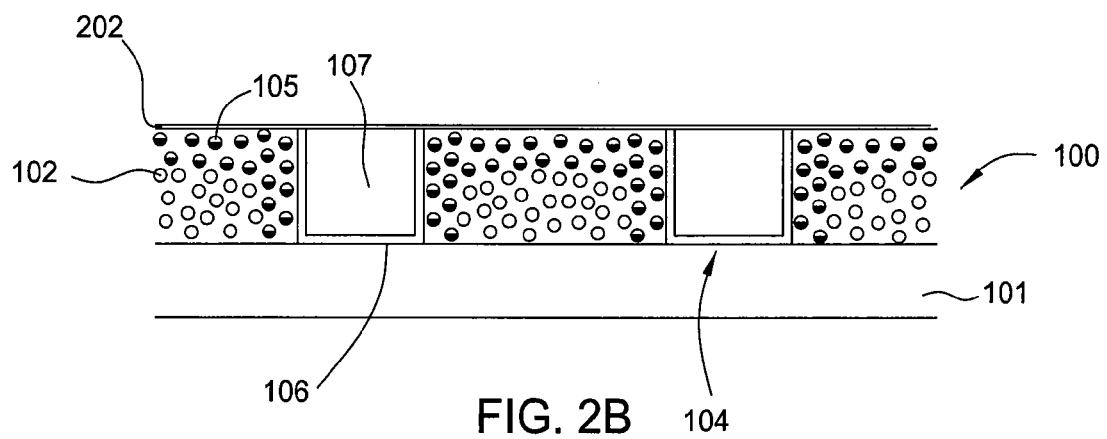

After the dielectric film 100 has been repaired, subsequent processes may be performed to continue the fabrication of the semiconductor device. For example, a diffusion barrier 106 may be deposited into the features 104 of the dielectric film 100 and a metal material 107, such as, for example, copper or a copper alloy, may be deposited into the features 104, as seen in FIG. 1D. It may be necessary to planarize the metal material 107 and remove any oxides from the metal material 107 that may form during planarization. Common metal oxide removal techniques involve the use of hydrogen or ammonia plasmas. The planarization and/or metal oxide removal processes may re-damage the surface of the dielectric film 100, as seen in FIG. 1E. The dielectric film 100 may be repaired using the repair processes described above. A thin carbon-containing film 202, similar to the carbon-containing film 201, may be deposited onto the repaired dielectric film 100 during the repair process, as seen in FIG. 2B. The thin carbon-containing film 202 may be up to 10 Å thick. The thin carbon-containing film 202 may be optionally removed, as shown in FIG. 1F, by sublimation or by diffusion into the dielectric film 100.

The repair processes described effectively lower the k-value of the damaged dielectric films thus enabling the continued scaling of semiconductor device features.

While the foregoing is directed to embodiments of the present invention, other and further embodiments of the invention may be devised without departing from the basic scope thereof, and the scope thereof is determined by the claims that follow.

The invention claimed is:

1. A method of repairing a damaged low k dielectric film, comprising:
positioning a dielectric film in a processing chamber;
heating the processing chamber;
flowing a carbon-containing precursor into the processing chamber;
exposing the carbon-containing precursor and the dielectric film to ultra violet (UV) radiation;
decomposing the carbon-containing precursor; and
depositing a carbon-containing compound into pores of the dielectric film.

2. The method of claim 1, wherein the carbon-containing precursor comprises at least one of 1,3-butadiene and isoprene.

3. The method of claim 2, wherein the UV radiation has wavelengths between 200 nm and 220 nm.

4. The method of claim 1, wherein the UV radiation has wavelengths between 20 nm and 230 nm.

5. The method of claim 1, wherein the decomposing the carbon-containing precursor comprises decomposing the carbon-containing precursor with the UV radiation.

6. The method of claim 1, wherein the processing chamber is at a pressure between 1 Torr and 100 Torr, the dielectric film is at a temperature between 0° C. and 400° C., the carbon-containing precursor is flown into the processing chamber at a flow rate between 10 sccm and 5000 sccm, and the dielectric film is processed for a processing time between 5 sec and 300 sec.

7. The method of claim 1, further comprising depositing a carbon-containing film on the dielectric film.

8. The method of claim 7, wherein the carbon-containing film is deposited to a thickness no greater than 10 Å.

9. The method of claim 7, further comprising removing the carbon-containing film from the dielectric film.

10. The method of claim 9, wherein the removing the carbon-containing film from the dielectric film comprises at least one of sublimating the carbon-containing film and diffusing the carbon-containing film into the dielectric film.

* * * * *